US011985748B2

(12) United States Patent
Maes et al.

(10) Patent No.: US 11,985,748 B2
(45) Date of Patent: May 14, 2024

(54) METHOD OF CONFIGURING A PLURALITY OF PARAMETERS OF A LIGHTING DEVICE

(71) Applicant: SIGNIFY HOLDING B.V., Eindhoven (NL)

(72) Inventors: Jérôme Eduard Maes, Eindhoven (NL); Chris Damkat, Eindhoven (NL); Bartel Marinus Van De Sluis, Eindhoven (NL); Bram Knaapen, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 18/008,206

(22) PCT Filed: May 26, 2021

(86) PCT No.: PCT/EP2021/064049
§ 371 (c)(1),
(2) Date: Dec. 5, 2022

(87) PCT Pub. No.: WO2021/244918
PCT Pub. Date: Dec. 9, 2021

(65) Prior Publication Data
US 2023/0284361 A1 Sep. 7, 2023

(30) Foreign Application Priority Data
Jun. 4, 2020 (EP) ..................................... 20178248

(51) Int. Cl.
*H05B 47/17* (2020.01)
*G06T 15/50* (2011.01)
*G06T 19/20* (2011.01)

(52) U.S. Cl.
CPC ........... *H05B 47/17* (2020.01); *G06T 15/506* (2013.01); *G06T 19/20* (2013.01); *G06T 2200/24* (2013.01); *G06T 2219/2004* (2013.01)

(58) Field of Classification Search
None
See application file for complete search history.

(56) References Cited

U.S. PATENT DOCUMENTS

2011/0245939 A1 10/2011 Crookham et al.
2015/0154808 A1 6/2015 Engelen et al.
(Continued)

FOREIGN PATENT DOCUMENTS

WO 2013186684 A2 12/2013
WO 2019120621 A1 6/2019
WO 2019228969 A1 12/2019

OTHER PUBLICATIONS

Hariharan, Anuja, et al., "Enhancing Product Configuration and Sales Process With Extended Reality," Springer Nature Switzerland, Augmented Reality and Virtual Reality, Progress in IS, 2020 (14 Pages).

*Primary Examiner* — Wilson Lee

(57) ABSTRACT

A method of configuring a plurality of parameters of a lighting device (320); wherein the plurality of parameters are configurable in a configuration mode and in an augmented reality mode; wherein the method comprises the steps of: selecting, in the configuration mode, a configuration set comprising at least one of the plurality of parameters of the lighting device; adjusting, in the configuration mode, the at least one of the plurality of parameters of the selected configuration set; switching to the augmented reality mode upon adjustment of the at least one of the plurality of parameters of the configuration set in the configuration mode and/or based on a user input; rendering, in the augmented reality mode, a virtual model of the lighting device
(Continued)

on an image rendering device (330) as an overlay on a view of a physical environment (310); wherein the model of the lighting device comprises the adjusted at least one of the plurality of parameters of the configuration set; automatically selecting, in the augmented reality mode, a augmented reality subset of the plurality of parameters of the lighting device; and automatically adjusting, in the augmented reality mode, parameters of the selected augmented reality subset based on environmental information of the physical environment upon switching to the augmented reality mode, wherein the augmented reality subset of the one or more parameters comprises one or more dimensional physical parameters of the lighting device, and wherein the physical parameters comprise parameters related to the physical properties of the lighting device.

14 Claims, 4 Drawing Sheets

(56) References Cited

U.S. PATENT DOCUMENTS

| | | |
|---|---|---|
| 2015/0278896 A1 | 10/2015 | Seuntiens et al. |
| 2017/0293349 A1 | 10/2017 | Mason et al. |
| 2018/0197339 A1 | 7/2018 | Puvvada Sathyanarayana et al. |
| 2019/0188913 A1 | 6/2019 | Cho et al. |
| 2020/0068687 A1 | 2/2020 | Harrison et al. |
| 2020/0151958 A1* | 5/2020 | Livneh .................... G06T 5/008 |
| 2021/0026441 A1* | 1/2021 | Spivack ............. G06Q 30/0601 |
| 2021/0201030 A1* | 7/2021 | Ju .......................... G06V 20/20 |
| 2021/0398316 A1* | 12/2021 | Panse .................... G06T 19/006 |
| 2022/0207848 A1* | 6/2022 | Islamov ................ G06T 19/006 |

* cited by examiner

METHOD OF CONFIGURING A PLURALITY OF PARAMETERS OF A LIGHTING DEVICE

CROSS-REFERENCE TO PRIOR APPLICATIONS

This application is the U.S. National Phase application under 35 U.S.C. § 371 of International Application No. PCT/EP2021/064049, filed on May 26, 2021, which claims the benefit of European Patent Application No. 20178248.9, filed on Jun. 4, 2020. These applications are hereby incorporated by reference herein.

FIELD OF THE INVENTION

The invention relates to a method of configuring a plurality of parameters of a lighting device; wherein the plurality of parameters are configurable in a configuration mode and in an augmented reality mode. The invention further relates to a system and a computer program product for configuring a plurality of parameters of a lighting device.

BACKGROUND

A luminaire is a device or structure arranged to emit light suitable for illuminating an environment, and comprises at least one light source or lamp, such as an LED-based lamp etc., optionally with any associated support, casing or other such housing. Each of the luminaires may take any of a variety of forms, e.g. a ceiling mounted luminaire, a wall-mounted luminaire, a wall washer, or a free-standing luminaire (and the luminaires need not necessarily all be of the same type).

Design of such a luminaire is an art. A configuration system or simply a configurator guides a user to select one or more design parameters, such as shape, type, size etc. of the luminaire. Different variations of configurators comprise representing, visualizing, assessing, and pricing which starts a learning-by-doing process for a user. The configurator, for the most part in a technical sense, is a software tool. In a typical luminaire configurator, a user can select a luminaire design and adjust certain parameters of it. The user may, for example, adjust the luminaire's color, its surface pattern, its shape, its light bulb, etc.

WO 2019/228969A1 discloses an electronic device (1) which is configured to obtain an image (49) of at least part of an environment, the image being captured with a camera, and determine a potential location for a lighting device (15,17) by analyzing the image. The electronic device is further configured to analyze a plurality of temporally sequential segments of content (41) being rendered or to be rendered by the electronic device and/or by a content rendering device (19) located in the environment, determine a virtual dynamic light effect (45,47) based on the analysis and the potential location determined for the lighting device and display the virtual dynamic light effect superimposed over a view on the environment while the content is being rendered. A current part of the virtual dynamic light effect corresponds to a current segment of the content.

SUMMARY OF THE INVENTION

The inventors have realized that, with current configurators, it is difficult for users to imagine how their luminaire design will actually look in their own environment (e.g. in user's home, office etc.). The inventors have further realized that with this limitation, a luminaire design which seems optimal for a user in the configurator may still be a poor design when placed in its target location in the user environment.

It is therefore an object of the present invention to provide an improved configurator to obtain an optimal luminaire design.

According to a first aspect, the object is achieved by a method of configuring a plurality of parameters of a lighting device; wherein the plurality of parameters are configurable in a configuration mode and in an augmented reality mode; wherein the method comprises the steps of: selecting, in the configuration mode, a configuration set comprising at least one of the plurality of parameters of the lighting device; adjusting, in the configuration mode, the at least one of the plurality of parameters of the selected configuration set; switching to the augmented reality mode upon adjustment of the at least one of the plurality of parameters of the configuration set in the configuration mode and/or based on a user input; rendering, in the augmented reality mode, a virtual model of the lighting device on an image rendering device as an overlay on a view of a physical environment; wherein the model of the lighting device comprises the adjusted at least one of the plurality of parameters of the configuration set; automatically selecting, in the augmented reality mode, a augmented reality subset of the plurality of parameters of the lighting device; and automatically adjusting, in the augmented reality mode, parameters of the selected augmented reality subset based on environmental information of the physical environment upon switching to the augmented reality mode.

The method provides configuration of a plurality of parameters of a lighting device in a configuration mode and in an augmented reality mode. In the configuration mode, a configuration set comprising at least one of the plurality of parameters may be selected. The at least one of the plurality of parameters of the selected configuration set may be then adjusted in the configuration mode. The selection and/or the adjustment may be a manual process, e.g. based on a user input or may be an automatic process. A hybrid approach of manual and automatic selection/adjustment may also be possible in the configuration mode.

The method further comprises, upon adjustment of the at least one of the plurality of parameters of the configuration set in the configuration mode, switching to an augmented reality mode. Additionally, and/or alternatively, the switching may be based on a user input. In the augmented reality mode, a virtual model of the lighting device may be rendered on an image rendering device as an overlay on a view of a physical environment, e.g. home, office etc. The rendered virtual model of the lighting device comprises the adjusted at least one of the plurality of parameters of the configuration set. This enables a user to visualize how the lighting device will appear at a possible target position in user's environment.

In the augmented reality mode, an augmented reality subset of the plurality of parameters may be automatically selected and further automatically adjusted based on environmental information of the physical environment. The environmental information may comprise dimensions and/or layout of the physical environment, for instance layout or dimensions of the room in a house, arrangement of furniture in user's room etc. Therefore, the method not only allows a user to visualize the lighting device in user's environment but also the automatic selection and adjustment based on the user's own environmental information provides an improved method of configuring a luminaire design.

In an embodiment, the augmented reality subset of the plurality of parameters may comprise one or more dimensional physical parameters of the lighting device.

The dimensional physical parameters may comprise, for instance, dimensions of the lighting device, dimensions or shape of a lighting device part, cord length of the lighting device etc. This is beneficial, because the lighting device, in the augmented reality mode, is automatically adjusted to fit the user's physical environment.

In an embodiment, the configuration set, and the augmented reality subset of the plurality of parameters may be non-overlapping.

In an example, the parameters of the augmented reality subset may comprise dimensional physical parameters such that, for instance, the parameters may be automatically adjusted in the augmented reality mode, whereas the at least one of the plurality of parameters of the configuration set may comprise non-dimensional parameters such as color, surface pattern or light source type of the lighting device. This is advantageous because it simplifies user selection. In this example, only those parameters which are not selected/adjusted in the configuration mode are then selected/adjusted in the augmented reality mode. Alternatively, the configuration set and the augmented reality subset may have overlapping parameters based, e.g., on a selection from a user.

In an embodiment, the configuration set, and/or the augmented reality subset of the plurality of parameters may be predetermined.

The parameters in the configuration set and augmented reality subset may be predetermined such that a user selection is further simplified.

In an embodiment, the method may further comprise: receiving a user preference input from a user indicative of: the selection and/or the adjustment of the at least one of the plurality of parameters of the configuration set; and/or the selection and/or the adjustment of the parameters of the augmented reality subset.

This embodiment enables a user-interactive configuration setup for the lighting device design. User preferences are received for the selection/adjustment of one or more parameters. In an example, the image rendering device may provide a user interface to receive the user preference input. Additionally, and/or alternatively, a configuration device may be arranged for receiving a user preference input for the selection/adjustment of the at least one of the plurality of parameters in the configuration mode. In another example, the image rendering device may be arranged for receiving a user preference input for both configuration and augmented reality modes. In an example, the user preference input is received via a voice command.

In an embodiment, the plurality of parameters of the lighting device may comprise physical parameters and light emission parameters; wherein the physical parameters comprise: color of the lighting device, surface pattern, shape, size, type, a light source type of the lighting device or its parts and/or cord length; and wherein the light emission parameters comprise: light color, color temperature, intensity, beam width, beam direction, beam shape, light output distribution and/or light emission intensity. In an embodiment, the method may further comprise determining if a combination of a user adjusted light emission parameters and physical parameters is infeasible; and automatically adjusting, in the augmented reality mode, the light emission and the physical parameters for a feasible combination.

A user preference may result in an infeasible combination of physical parameters and light emission parameters. For example, a user selected light source (e.g. the light bulb or module) or the lighting device type cannot provide a user selected illuminance level. In such cases, the method may advantageously automatically adjust, in the augmented reality mode, the light emission and the physical parameters. For example, the illuminance level may be automatically adjusted such that the user selected light bulb may provide such illuminance level. Optionally, user feedback may be provided to indicate the adjustment (and optionally its rationale) to the user, which could be done by rendering a visual indication or by providing an auditory (spoken) output. The selection of light emission parameters may be defined in terms of (or in order to achieve) an illuminance level in the physical environment, illuminance levels on the table, light spot shape on the wall etc.

In an advanced embodiment, a priority value may be assigned to the user preference input, such that the user assigns a priority to his selection. For example, the user may assign a low priority value to a light source selection and high priority value to the illuminance level. In this case, the method may select/adjust a different light source which may provide the user selected illuminance level.

In an embodiment, the method may further comprise obtaining, in the augmented reality mode, a depth map or a 3D model of a viewed area in the physical environment.

The image rendering device may have means to receive a depth map or a 3D model of the viewed area in the physical environment. The image rendering device may receive the depth map or the 3D model from one an external device (e.g. in cloud) or an internal device (e.g. physical present in the physical environment such as lighting device, sensor etc.). It helps to realistically adjust the lighting device dimensions, scale and orientations, with respect to the physical environment. It may further enable calculating how a particular light setting of the lighting device effects the physical environment.

In an embodiment, the method may further comprise determining a position of the virtual model of the lighting device in the physical environment based on the plurality of parameters of the lighting device and/or on a user input.

The position of the virtual model may be advantageously automatically determined by, for instance, using an image of the physical environment and analyzing characteristics, such as dimensions and lay-out of the physical environment. For example, a pendant ceiling lamp may be positioned in the center of the ceiling or may be centered above a desk or table. Additionally, and/or alternatively, a user may indicate the position of the virtual model based on his preference.

In an embodiment, the augmented reality mode, the adjustment of the parameters of the selected augmented reality subset may occur upon receiving a user acceptance of the position of the virtual model of the lighting device in the physical environment.

A correct position of the virtual model is important for the adjustment of the plurality of parameters of the lighting device. Therefore, in this advantageous embodiment, the automatic adjustment in the augmented reality mode may occur once the user accepts the position of the virtual model. Such user acceptance may be derived from an explicit confirmation input from the user or may be derived from other inputs such as the user's gaze or facial expression or from detected movements of the configuration device.

In an embodiment, the method may further comprise receiving a signal indicative of a position and/or an orientation information of the image rendering device; and switching to the augmented reality mode based on the received signal.

For instance, switching to the augmented reality mode may take place when the image rendering device is moved up or hold substantially vertical, while switching back to the configuration mode may take place when the image rendering device is held substantially horizontal. In an another example, switching to the augmented reality mode may be based on switching of a display of the image rendering device from landscape to portrait orientation.

According to a second aspect, the object is achieved by a system for configuring a plurality of parameters of a lighting device; wherein the system comprises: an image rendering device according to the first aspect; a configuration device; one or more controllers arranged for executing the steps of the method according to the first aspect.

In an example, a signal indicative of a position and/or an orientation information of the configuration device may be received; and wherein and switching to the augmented reality mode may be based on the received position and/or the received orientation information of the configuration device.

According to a third aspect, the object is achieved by an image rendering device for configuring a plurality of parameters of a lighting device; wherein the image rendering device comprises: a display arranged for displaying a virtual model of the lighting device as an overlay on a view of a physical environment; a processor arranged for executing the method steps according to the first aspect. In an example, the processor may be arranged for executing (at least) the method steps of selecting and/or adjusting parameters of the augmented reality subset in the augmented reality mode according to the first aspect.

According to a fourth aspect, the object is achieved by a configuration device for configuring a plurality of parameters of a lighting device; wherein the configuration device comprises: means for receiving a user preference input from a user indicative of a selection and/or an adjustment of the at least one of the plurality of parameters of the configuration set in a configuration mode; a processor for executing the method steps of selecting and/or adjusting the at least one of the plurality of parameters of the configuration set in the configuration mode according to the first aspect.

The one or more controller according to the second aspect may be implemented in a unit separate from the image rendering device/configuration device, such as wall panel, desktop computer terminal, or even a portable terminal such as a laptop, tablet or smartphone. Alternatively, the one or more controller may be incorporated into the same unit as the image rendering device and/or configuration device. Further, the one or more controllers may be implemented in the physical environment or remote from the environment (e.g. on a server of the building or even outside the building at a different geographical site); and the one or more controller may be implemented in a single unit or in the form of distributed functionality distributed amongst image rendering device and configuration device. Furthermore, the one or more controller may be implemented in the form of software stored on a memory (comprising one or more memory devices) and arranged for execution on a processor (comprising one or more processing units), or the one or more controllers may be implemented in the form of dedicated hardware circuitry, or configurable or reconfigurable circuitry such as a PGA or FPGA, or any combination of these.

According to a fifth aspect, the object is achieved by a computer program product comprising instructions which, when the program is executed by a computer, cause the computer to carry out the steps of the method of the first aspect.

It should be understood that the computer program product, the system and the devices may have similar and/or identical embodiments and advantages as the above-mentioned methods.

BRIEF DESCRIPTION OF THE DRAWINGS

The above, as well as additional objects, features and advantages of the disclosed systems, devices and methods will be better understood through the following illustrative and non-limiting detailed description of embodiments of systems, devices and methods, with reference to the appended drawings, in which.

All the figures are schematic, not necessarily to scale, and generally only show parts which are necessary in order to elucidate the invention, wherein other parts may be omitted or merely suggested.

DETAILED DESCRIPTION OF EMBODIMENTS

Figure 1:
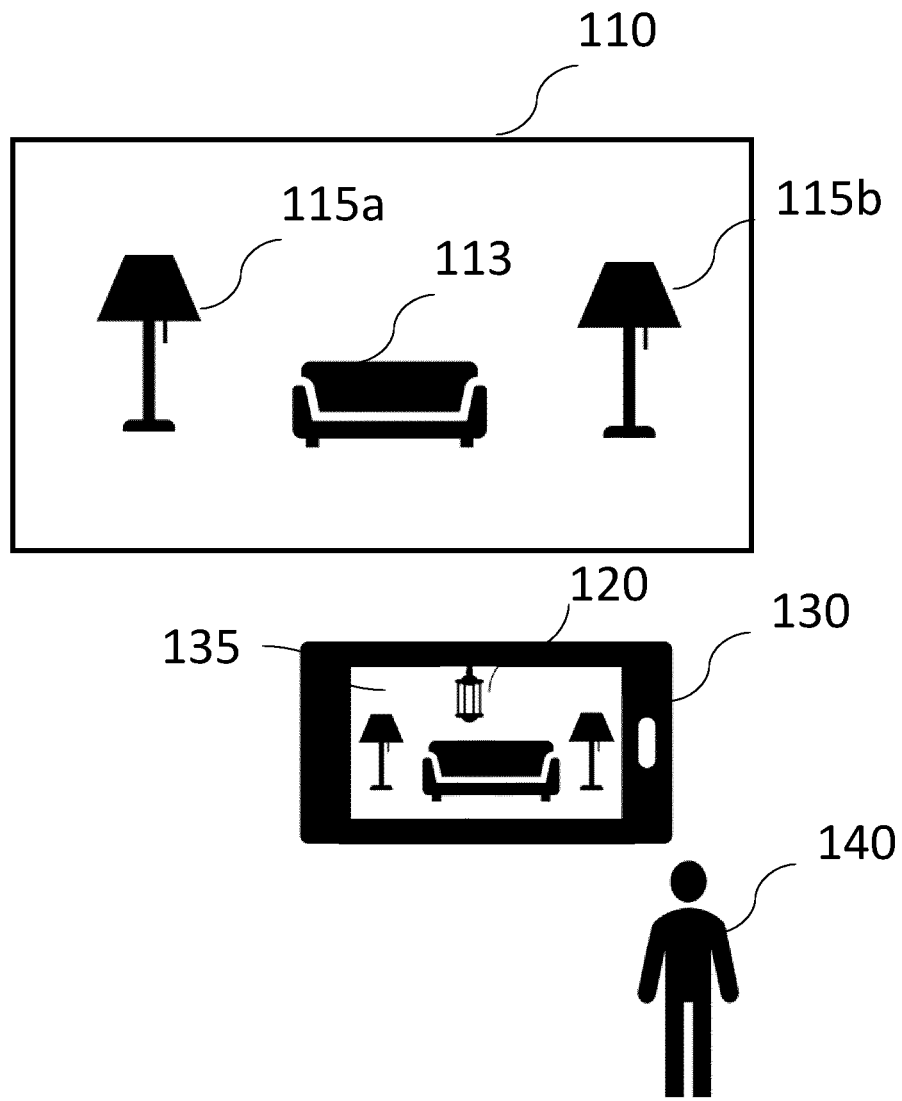
FIG. 1 shows schematically and exemplary an embodiment of a system for configuring a plurality of parameters of a lighting device.

FIG. 1 shows schematically and exemplary an embodiment of a system 100 for configuring a plurality of parameters of a lighting device 120. The system 100 comprises an environment 110. For example, the environment 110 may comprise a room in a house, an office, a restaurant etc. The environment 110 may comprise furniture 113, which is shown as a sofa 113 in this figure. The furniture 113 may be of any type as commonly found in the room/office such as table, chair, sleeping bed etc. The environment 110 may further comprise lighting devices 115a-b. In this exemplary figure, only two standing lamps are shown as the lighting devices, any number and/or type of the lighting devices 115a-b may be located in the environment 110. The environment 110 may further comprise, though now shown in FIG. 1, HVAC devices, sensors, electronic devices such as laptop, television etc. Any other devices appropriate to the type of environment 110 from/office/restaurant etc.) is not excluded.

The system 100 may further comprise an image rendering device 130. In this exemplary figure, the image rendering device 130 is a smartphone. Other examples of the image rendering device 130 may comprise laptop, tablet, camera or any wearables such as glasses. The image rendering device 130 may comprise a display 135 and (optionally) means for receiving a user preference input such as a user interface (not shown). The image rendering device 130 may be an augmented reality compatible device, such that the image rendering device 130 may comprise all the hardware, for instance, a processor, GPS, a display, camera, microphone etc., which is required for augmented reality. A user 140 may view the environment 110 in the display 135 of the image rendering device 130. The view may be a digital view (e.g. via an augmented reality enabled camera) or an optical view (e.g. via a wearable glasses).

The user 140 may want to select and configure a new lighting device 120 intended to be placed in the environment 110. The user 140 may render a virtual model of the lighting device 120 on the image rendering device 130 as an overlay on a view of the (physical) environment 110. The plurality of parameters of the lighting device 120 may be configured using the method as discussed later.

Figure 2:
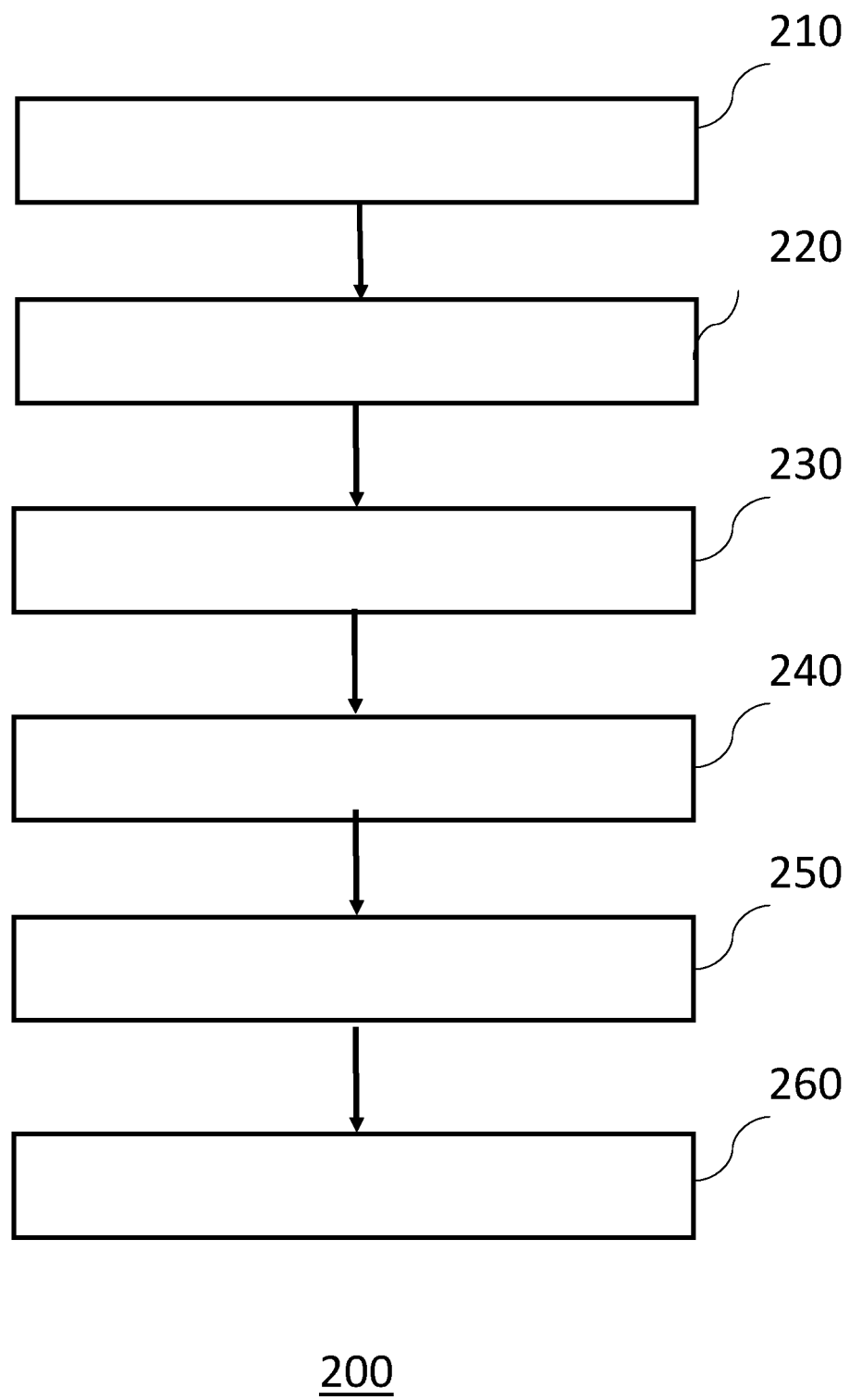
FIG. 2 shows schematically and exemplary a flowchart illustrating an embodiment of a method for configuring a plurality of parameters of a lighting device.

FIG. 2 shows schematically and exemplary a flowchart illustrating an embodiment of a method 200 for configuring a plurality of parameters of a lighting device 120. The plurality of parameters may be configurable in a configuration mode and in an augmented reality mode. The plurality of parameters of the lighting device 120 may comprise physical parameters and/or light emission parameters. The physical parameters may comprise parameters related to the physical properties of the lighting device 120 such as color of the lighting device, surface pattern, shape, size, type, a light source of the lighting device and/or cord length. The light emission parameters may comprise parameters related to the light emission properties of the lighting device 120 such as light (emission) color, color temperature, intensity, beam width, beam direction and/or light (emission) intensity. The physical parameters may be further divided into dimensional physical parameters which may comprise parameters related to the dimensions of the lighting device 120 such as cord length, size of the lighting device shade or length of the lighting pole (when the lighting device 120 is of a floor lamp) etc.

The method 200 may comprise selecting 210, in the configuration mode, a configuration set comprising at least one of the plurality of parameters of the lighting device 120. The selection 210 may be a manual step, e.g. based on a user input or a predetermined selection. In an example, the configuration set may comprise all parameters of the lighting device 120. The configuration set may comprise physical parameters and/or light emission parameters.

The method 200 may comprise adjusting 220, in the configuration mode, the at least one of the plurality of parameters of the selected configuration set. The adjustment 220 may be a manual step, e.g. based on a user input or a predetermined adjustment. The steps of selection 210 and/or adjustment 220 may be executed by a configuration device (not shown). The configuration device may comprise means for receiving a user preference input from a user 140 indicative of a selection 210 and/or an adjustment 220 of the at least one of the plurality of parameters of the configuration set in a configuration mode. The configuration device may comprise a user interface for receiving the user preference input. The user interface may allow user 140 to provide user preference input via a voice command. The configuration device may further comprise a processor for executing the method steps of selecting 210 and/or adjusting 220 the at least one of the plurality of parameters of the configuration set in the configuration mode.

The method 200 may further comprise switching 230 to the augmented reality mode upon adjustment 220 of the at least one of the plurality of parameters of the configuration set in the configuration mode and/or based on a user 140 input. The switching 230 may be an automatic step carried out upon the adjustment 220 of the at least one of the plurality of parameters of the configuration set in the configuration mode. Additionally, and/or alternatively, the switching 230 may be based on a user 140 input. The user 140 input may be received via the configuration device or via the image rendering device 130. In an example, the configuration device and the image rendering device 130 are comprised in one device. Alternatively, the configuration device may be different from the image rendering device 130. For example, the configuration device may comprise a mobile touchscreen device, whereas the image rendering device 130 may comprise a wearable glass device. In this case, the user preference input may be either received on the wearable glasses (e.g. voice commands, gestures in front of the glasses, or touch inputs on the wearable device), or may be received on the mobile device such that the configuration of the lighting device 120 becomes distributed over both a handheld and a wearable device.

The method 200 may further comprise rendering 240, in the augmented reality mode, a virtual model of the lighting device 120 on an image rendering device 130 as an overlay on the (physical) environment 110. The model of the lighting device 120 may comprise the adjusted at least one of the plurality of parameters of the configuration set.

In an example, a position of the virtual model of the lighting device 120 in the physical environment 110 may be determined based on the plurality of parameters of the lighting device 120 and/or on a user input. For example, a ceiling lamp is intended to be placed on the ceiling. The user 140 may indicate an exact position in the ceiling. In another example, a study lamp is intended to be placed on a table. In an example, a position of the virtual model may be further determined based on an analysis of physical environment 110, e.g. room, dimensions and lay-out. For instance, a pendant ceiling lamp may be positioned in the center of the ceiling or may be centered above a desk or a table.

A position can also be determined based on the position of detected existing light sources 115*a-b* or windows in the physical environment 110. For instance, a floor lamp may be positioned in between two existing ceiling downlights, or the lighting device 120 may be automatically positioned at a spot which looks relatively dark. In an example, multiple determined positions may be indicated to the user 140, e.g. via the display 135 of the image rendering device 130. For instance, subtle markers may indicate alternative positions, or a user 140 may browse through various positions by tapping the display 135. The image rendering device 130 may also detect a significant move of the image rendering device 130 and may determine an alternative position based on the new image of the physical environment 110.

The method 200 may further comprise automatically selecting 250, in the augmented reality mode, an augmented reality subset of the plurality of parameters of the lighting device. In an example, the configuration set and the augmented reality subset of the parameters are non-overlapping. In other words, different parameters are selected/adjusted in the configuration and in the augmented reality mode. In this example parameters which are not selected/adjusted in the configuration mode are selected/adjusted in the augmented reality mode. In another example, the configuration set and/or the augmented reality subset of the plurality of parameters are predetermined. The predetermined selection of the configuration set and/or the augmented reality subset may be based on a user 140 input.

The method 200 may further comprise automatically adjusting 260, in the augmented reality mode, parameters of the selected augmented reality subset based on environmental information of the physical environment 110 upon switching to the augmented reality mode. In an example, a hybrid approach, in the augmented reality mode, of manual selection/adjustment and automatic selection 250/adjustment 260 may be used.

In an example, the augmented reality subset of the plurality of parameters may comprise one or more dimensional physical parameters of the lighting device, which are automatically adjusted 260 based on the environmental information of the physical environment 110. In another example, it is also possible to customize the mounting or placement surface of the lighting device 120 to environmental information of the physical environment 110. For instance, the size of the ceiling cap may be automatically adjusted 260 to the size of a hole in the ceiling which needs to be covered. Or the finishing or material for the bottom side of a table lamp may be adjusted if the lamp is positioned on a glass table (e.g. felt caps).

Furthermore, the lighting device 120 typically needs a power connection, and the image rendering device 130 may detect the position of power outlets in the ceiling or in the wall. The lighting device 120 may be positioned at or near such a power outlet, or the parameters of the lighting device 120 may be adjusted 250 such that the power outlet can be easily reached (e.g. cable length) or is covered by the lighting device 120 housing (e.g. an enlarged ceiling cap).

In an embodiment, if a combination of a user adjusted 220 light emission parameters and physical parameters is infeasible; automatically adjusting 250, in the augmented reality mode, the light emission and the physical parameters for a feasible combination. in the augmented reality mode, the adjustment of the parameters of the selected augmented reality subset occurs upon receiving a user acceptance of the position of the virtual model of the lighting device in the physical environment.

Figure 3:
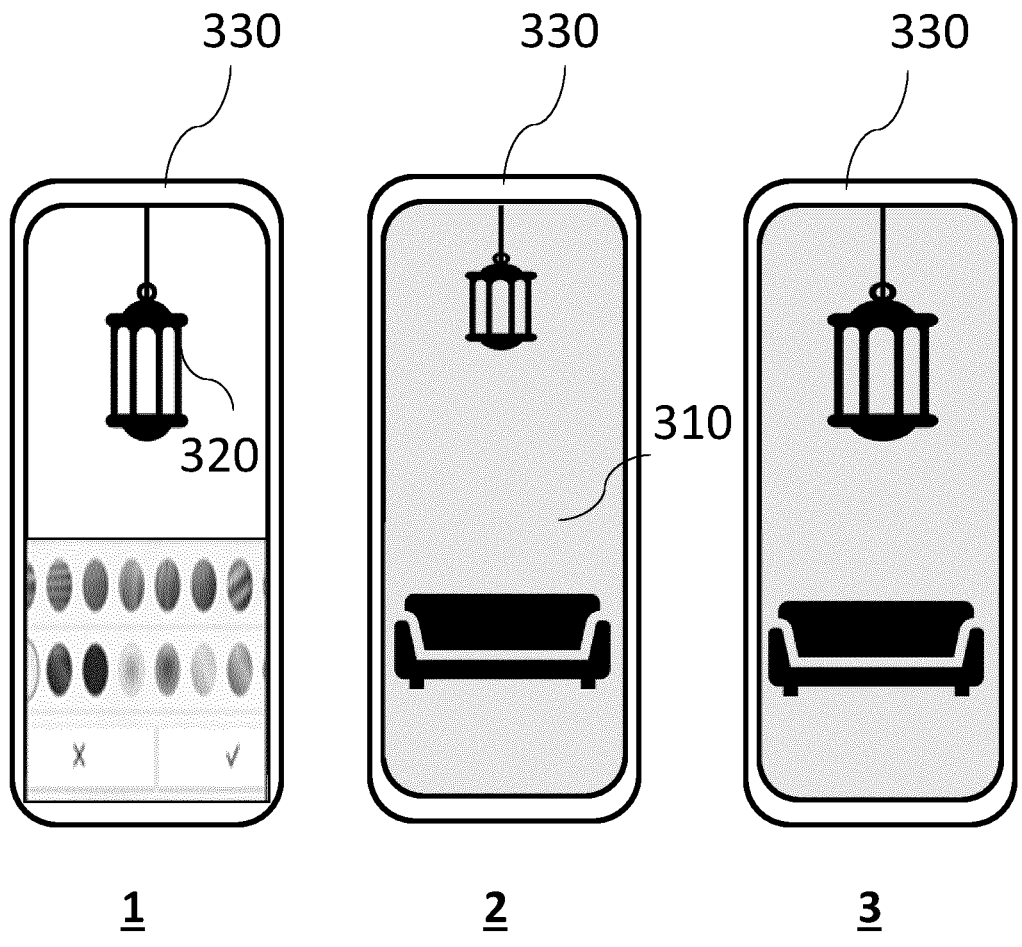
FIG. 3 shows schematically and exemplary an embodiment of a method for configuring a plurality of parameters of a lighting device.

FIG. 3 shows schematically and exemplary an embodiment of a method for configuring a plurality of parameters of a lighting device 320. In step 1 of configuring the plurality of parameters of the lighting device 320, the method steps of selecting 210 and adjusting 220, in the configuration mode, are exemplary shown to be performed via the image rendering device 330. These steps may be performed via a configuration device. In these steps, the at least one of the plurality of parameters in a configuration set is selected 210 and adjusted 220. Different options to select/adjust physical and/or light emission parameters are provided. In step 2, the method steps of switching 230 to an augmented reality mode and rendering 240 of a virtual model of the lighting device 320 on the image rendering device 330 as an overlay on a view of the physical environment 310 is exemplary shown. The rendered 240 virtual model of the lighting device 320 comprises the selected 210/adjusted 220 at least one of the plurality of parameters in the configuration mode. The selection 210/adjustment 220 which may seem optimal in the configuration mode, which when rendered 240 as overlay on a view of the physical environment 310 does not match the physical environment. In step 3, the method steps of automatically selecting 250 and adjusting 260, in the augmented reality mode, are exemplary shown. The automatic selection 250/adjustment 260 may be based on the physical environmental information of the physical environment upon switching to the augmented reality mode.

In an example, the method 200 may obtain, in the augmented reality mode, a depth map or a 3D model of a viewed area in the physical environment 310, which helps to realistically adjust the lighting device 320 dimensions, scale and orientations, but also enables calculating how a particular light setting effects the physical environment 310. For example, the light setting which renders the light effects may further be optimized to environmental information of the physical environment 310 (e.g. room type, dimensions). Dimensions of the inner shape of the lighting device 320 may be automatically adjusted 260 to achieve a desired effect (e.g. illuminate an entire target surface, e.g. a dinner table).

In another example, one or more parameters of the inner surface of the lighting device 320 may be automatically adjusted 260 in order to achieve a desired light distribution. For instance, the inner material, shape or finishing of a lamp shade or the shape of a reflector can be adjusted based on spatial properties of the target environment. Dependent on the luminaire position relative to its target surface the inner shape may be adjusted. For instance, if the lighting device 320 is positioned above a circular table, the inner shape may be adjusted such that the entire table is uniformly lit. In the case, that the lighting device 320 is moved from a central to an off-center position, the inner shape may be adjusted accordingly, resulting in an asymmetrical inner shape which is able to realize a uniform light distribution on the target surface.

Figure 4:
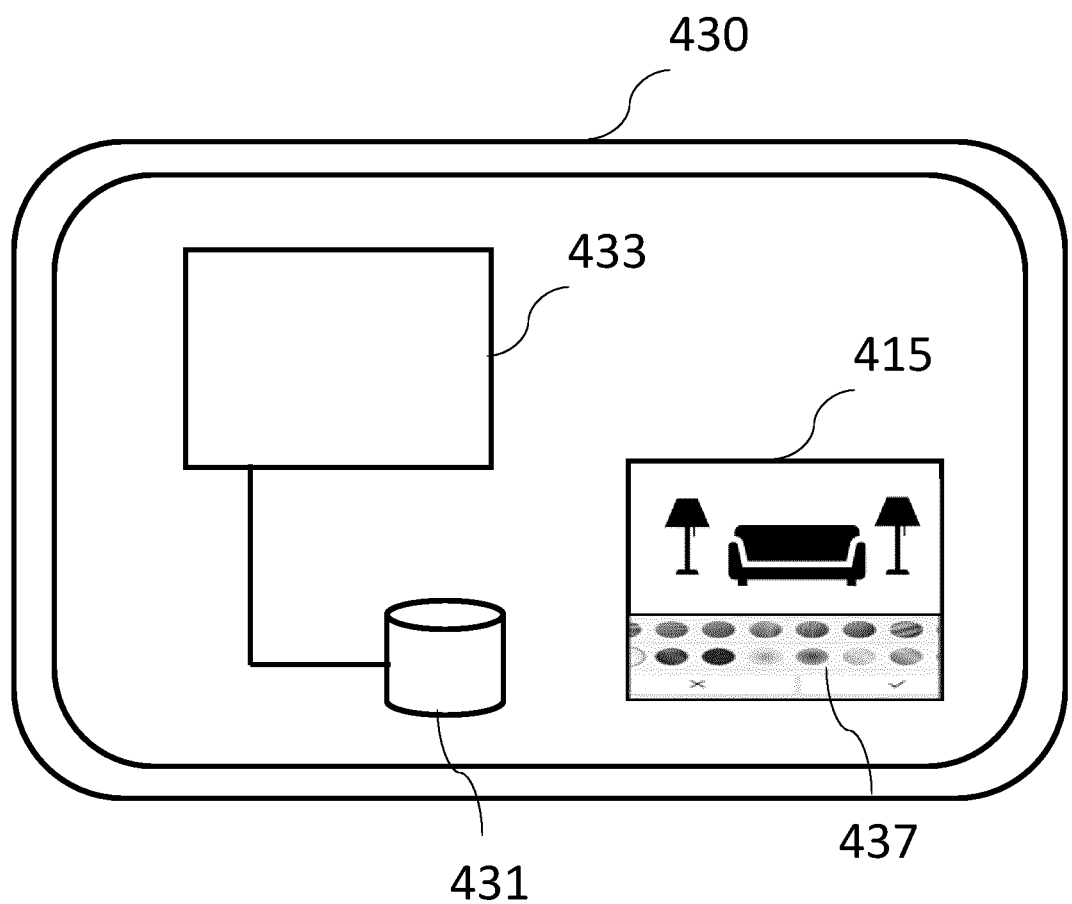
FIG. 4 shows schematically and exemplary an image rendering device according to an embodiment of the method.

FIG. 4 shows schematically and exemplary an image rendering device 430 according to an embodiment of the method 200. The image rendering device 430 may comprise a display 415, which may be arranged to display arranged for displaying a virtual model of the lighting device as an overlay on a view of a physical environment. The image rendering device 430 may have an imaging unit such as a camera (not shown) to capture an image of the physical environment 110, 310. The image rendering device 130 may be an augmented reality compatible device, such that the image rendering device 130 may comprise all the hardware which is required for augmented reality.

The image rendering device 430 may comprise one or more user interface elements 437. In an example, the one or more user interface elements 437 for selecting/adjusting the parameters of the configuration set/augmented reality subset may be rendered on the display 415. If, for example, the size of the lighting device 120, 320 has been automatically adjusted 260 in the augmented reality mode, a size adjustment user interface element 437 may be rendered enabling the user to further adjust the size. Other user interface elements 437 for adjusting other parameters may not be visible on the display 415, or at least not directly adjustable. They may, for instance, be 'hidden' in a menu.

Additionally, the user interface for receiving selecting/adjusting of the parameters of the configuration set/augmented reality subset may be a voice-activated user interface. If the input is provided by a voice command, the type of command may be very much dependent on the mode it is in especially in relation to the context. E.g.: "make the luminaire the size of half the table's width". In case of a multi-light pendant: "Give me the right number of heads to sufficiently light the table". Or: "use the same color as the speaker next to the tv".

The image rendering device 430 may further comprise a processor 433 arranged for executing the method steps 210-260. Alternatively, the processor 433 may be arranged for (at least) executing the steps of automatic selection 250/adjustment 260 of the parameters of the augmented reality subset in the augmented reality mode. The image rendering device 430 may further (optionally) comprise a memory 431 may be arranged for storing one or more of images of the physical environment 110, 310, predetermined parameters of the configuration set/augmented reality subset, predetermined selection/adjustment recommendations etc.

The method 200 may be executed by computer program code of a computer program product when the computer program product is run on a processing unit of a computing device, such as the processor 433 of the image rendering device 430.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer or processing unit. In the device claim enumerating several means, several of these means may be embodied by one and the same item of hardware. The mere fact that certain measures are recited in mutually different dependent claims does not indicate that a combination of these measures cannot be used to advantage.

Aspects of the invention may be implemented in a computer program product, which may be a collection of computer program instructions stored on a computer readable storage device which may be executed by a computer. The instructions of the present invention may be in any interpretable or executable code mechanism, including but not limited to scripts, interpretable programs, dynamic link libraries (DLLs) or Java classes. The instructions can be provided as complete executable programs, partial executable programs, as modifications to existing programs (e.g. updates) or extensions for existing programs (e.g. plugins). Moreover, parts of the processing of the present invention may be distributed over multiple computers or processors or even the 'cloud'.

Storage media suitable for storing computer program instructions include all forms of nonvolatile memory, including but not limited to EPROM, EEPROM and flash memory devices, magnetic disks such as the internal and external hard disk drives, removable disks and CD-ROM disks. The computer program product may be distributed on such a storage medium, or may be offered for download through HTTP, FTP, email or through a server connected to a network such as the Internet.

The invention claimed is:

1. A method of configuring one or more parameters of a lighting device; wherein the one or more parameters is configurable in a configuration mode and in an augmented reality mode;

wherein the method comprises the steps of:
  selecting, in the configuration mode via a configuration device, a configuration set comprising at least one of the one or more parameters of the lighting device based on user input;
  adjusting, in the configuration mode via a configuration device, the at least one of the one or more parameters of the selected configuration set based on user input;
  switching to the augmented reality mode upon adjustment of the at least one of the one or more parameters of the configuration set in the configuration mode and/or based on a user input;
  rendering, in the augmented reality mode, a virtual model of the lighting device on an image rendering device as an overlay on a view of a physical environment; wherein the model of the lighting device comprises the adjusted at least one of the one or more parameters of the configuration set;
  automatically selecting, in the augmented reality mode via the image rendering device, an augmented reality subset of the one or more parameters of the lighting device; and
  automatically adjusting, in the augmented reality mode via the image rendering device, the at least one of the one or more parameters of the selected augmented reality subset based on environmental information of the physical environment upon switching to the augmented reality mode; wherein the environmental information comprises dimensions and/or layout of the physical environment; and
  wherein the augmented reality subset of the one or more parameters comprises one or more dimensional physical parameters of the lighting device related to the dimensions of the lighting device, and wherein the physical parameters comprise parameters related to the physical properties of the lighting device.

2. The method according to claim 1, wherein the configuration set and the augmented reality subset of the plurality of parameters are non-overlapping.

3. The method according to claim 1, wherein the configuration set and/or the augmented reality subset of the one or more parameters are predetermined.

4. The method according to claim 1, wherein the method further comprises:
  receiving a user preference input from a user indicative of:
    the selection and/or the adjustment of the at least one of the one or more parameters of the configuration set.

5. The method according to claim 1, wherein the one or more parameters of the lighting device comprise physical parameters and/or light emission parameters;
  wherein the physical parameters comprise: color of the lighting device, surface pattern, shape, size, type, a light source type of the lighting device and/or cord length; and
  wherein the light emission parameters comprise: light color, color temperature, intensity, beam shape, light output distribution, beam width, beam direction and/or light intensity.

6. The method according to claim 5, wherein the method further comprises:
  determining if a combination of a user adjusted light emission parameters and physical parameters is infeasible;
  automatically adjusting, in the augmented reality mode, the light emission and the physical parameters for a feasible combination.

7. The method according to claim 1, wherein the method further comprises:
  obtaining, in the augmented reality mode, a depth map or a 3D model of a viewed area in the physical environment.

8. The method according to claim 1, wherein the method further comprises:
  determining a position of the virtual model of the lighting device in the physical environment based on the plurality of parameters of the lighting device and/or on a user input.

9. The method according to claim 8, wherein, in the augmented reality mode, the adjustment of the parameters of the selected augmented reality subset occurs upon receiving a user acceptance of the position of the virtual model of the lighting device in the physical environment.

10. The method according to claim 1, wherein the method further comprises:
receiving a signal indicative of a position and/or an orientation information of the image rendering device;
switching to the augmented reality mode based on the received signal.

11. A system for configuring one or more parameters of a lighting device; wherein the system comprises:
an image rendering device;
a configuration device;
one or more controllers arranged for executing the steps of the method according to claim 1.

12. An image rendering device for configuring one or more parameters of a lighting device; wherein the image rendering device comprises:
a display arranged for displaying a virtual model of the lighting device as an overlay on a view of a physical environment;
a processor arranged for executing the method steps according to claim 1.

13. A configuration device for configuring one or more parameters of a lighting device; wherein the configuration device comprises:
means for receiving a user preference input from a user indicative of a selection and/or an adjustment of at least one of the plurality of parameters of a configuration set in a configuration mode;
a processor for executing the method steps of selecting and/or adjusting the at least one of the plurality of parameters of the configuration set in the configuration mode according to claim 1.

14. A computer program product comprising instructions which, when the program is executed by a computer, cause the computer to carry out the steps of the method of claim 1.

* * * * *